United States Patent
Shin et al.

(10) Patent No.: US 7,709,927 B2
(45) Date of Patent: May 4, 2010

(54) SHALLOW TRENCH ISOLATION STRUCTURES FOR SEMICONDUCTOR DEVICES INCLUDING WET ETCH BARRIERS

(75) Inventors: Dong-suk Shin, Gyeonggi-do (KR); Il-young Yoon, Gyeonggi-do (KR); Yong-kuk Jeong, Gyeonggi-do (KR); Jung-shik Heo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/123,817

(22) Filed: May 20, 2008

(65) Prior Publication Data
US 2008/0290446 A1    Nov. 27, 2008

(30) Foreign Application Priority Data
May 22, 2007    (KR) .................. 10-2007-0049960

(51) Int. Cl.
*H01L 21/76* (2006.01)
(52) U.S. Cl. .............. 257/510; 257/E21.546; 257/515; 438/426
(58) Field of Classification Search .......... 257/E21.546, 257/E21.549, E21.573, 510, E21.547, 515; 438/434, 426
See application file for complete search history.

(56) References Cited

U.S. PATENT DOCUMENTS

| | | | |
|---|---|---|---|
| 6,323,106 B1 | 11/2001 | Huang et al. | |
| 6,699,773 B2 * | 3/2004 | Lee et al. | 438/424 |
| 6,953,734 B2 | 10/2005 | Lim et al. | |
| 7,163,869 B2 | 1/2007 | Kim et al. | |
| 7,208,812 B2 * | 4/2007 | Ohta | 257/510 |
| 2002/0094620 A1 | 7/2002 | Sandhu et al. | |
| 2004/0238914 A1 * | 12/2004 | Deshpande et al. | 257/506 |
| 2005/0250293 A1 * | 11/2005 | Jung | 438/424 |
| 2006/0160322 A1 | 7/2006 | Buehrer et al. | |

FOREIGN PATENT DOCUMENTS

| | | |
|---|---|---|
| KR | 10-2004-0058965 A | 7/2004 |
| KR | 10-2005-0002061 A | 1/2005 |
| KR | 10-2005-0012005 A | 1/2005 |
| KR | 10-2005-0014166 A | 2/2005 |
| KR | 10-2005-0052873 A | 6/2005 |
| KR | 10-2005-0078897 A | 8/2005 |

OTHER PUBLICATIONS

U.S. Appl. No. 12/106,671, filed Apr. 21, 2008, Shin et al.

* cited by examiner

*Primary Examiner*—Davienne Monbleau
*Assistant Examiner*—Shweta Mulcare
(74) *Attorney, Agent, or Firm*—Myers Bigel Sibley & Sajovec, P.A.

(57) ABSTRACT

A semiconductor device includes a sidewall oxide layer covering an inner wall of a trench, a nitride liner on the sidewall oxide layer and a gap-fill insulating layer filling the trench on the nitride liner. A first impurity doped oxide layer is provided at edge regions of both end portions of the sidewall oxide layer so as to extend from an entry of the trench adjacent to an upper surface of the substrate to the nitride liner. A dent filling insulating layer is provided on the nitride liner in the trench to protect a surface of the first impurity doped oxide layer. Related methods are also disclosed.

11 Claims, 6 Drawing Sheets

SHALLOW TRENCH ISOLATION STRUCTURES FOR SEMICONDUCTOR DEVICES INCLUDING WET ETCH BARRIERS

CROSS-REFERENCE TO RELATED PATENT APPLICATION

This application claims priority under 35 USC § 119 to Korean Patent Application No. 10-2007-0049960, filed on May 22, 2007, the disclosure of which is hereby incorporated herein by reference in its entirety as if set forth fully herein.

FIELD OF THE INVENTION

The present invention relates to semiconductor integrated circuit devices and methods of manufacturing the same, and more particularly, to semiconductor devices having shallow trench isolation (STI) structures and methods of manufacturing the same.

BACKGROUND OF THE INVENTION

As the integration of semiconductor (i.e., integrated circuit) devices increases, isolation technology for electrically isolating adjacent devices has become more important. A shallow trench isolation (STI) formation process has been widely used as an isolation technology in manufacturing processes of high integration semiconductor devices. Various scaling technologies for manufacturing highly integrated semiconductor devices have been developed. Also, as a feature size of semiconductor devices becomes smaller, it may become more difficult to form STI structures for isolation.

Various isolation processes using STI have been suggested. In an example of a conventional isolation processes, a trench is formed in a substrate by using a nitride layer pattern, which is formed on the substrate, as an etching mask. A nitride liner is formed in the trench, and then an isolation layer is formed by filling an insulating material thereon. Then, a wet etching process is performed to remove the nitride layer pattern on the substrate. However, the nitride liner exposed near an upper edge of the trench may be consumed to a predetermined depth from an upper surface of the substrate, such that a dent is formed near the upper edge of the trench. This may adversely impact device properties.

SUMMARY OF THE INVENTION

According to some embodiments of the present invention, a semiconductor device includes a substrate having a trench therein, a sidewall oxide layer on an inner wall of the trench, a nitride liner on the sidewall oxide layer and a gap-fill insulating layer on the nitride liner to fill the trench. An impurity doped oxide layer is provided at edge regions of both end portions of the sidewall oxide layer and extending from an entry of the trench adjacent to a surface of the substrate, to the nitride liner.

The impurity doped oxide layer may consist of a silicon oxide layer doped with N atoms.

According to other embodiments of the present invention, the impurity doped oxide layer is a first impurity doped oxide layer and the semiconductor device may include a second impurity doped oxide layer extending from the both end portions of the nitride liner to a surface of the gap-fill insulating layer.

Also, according to still other embodiments of the present invention, the semiconductor device may further include a dent filling insulating layer on a surface of the first impurity doped oxide layer and on the nitride liner.

Semiconductor devices according to other embodiments of the present invention include a substrate having a trench extending therein from a surface thereof and having a trench wall. A sidewall oxide layer is provided on the trench wall that includes a sidewall oxide layer edge that is recessed from the surface of the substrate. A nitride liner is also provided on the sidewall oxide layer remote from the trench wall and including a nitride liner edge. The sidewall oxide layer edge is also recessed from the nitride liner edge such that the nitride liner includes a protruding portion relative to the sidewall oxide layer edge. A trench insulating layer is provided on the nitride liner remote from the sidewall oxide layer. A wet etch barrier layer extends along the trench wall from the surface of the substrate to the sidewall oxide layer edge, along the sidewall oxide layer edge to the protruding portion of the nitride layer and along the protruding portion of the nitride layer.

In some embodiments, the wet etch barrier also extends from the protruding portion of the nitride layer along the trench insulating layer. Moreover, in other embodiments, the device further includes an edge insulating layer on the nitride liner edge and extending onto the wet etch barrier layer. In still other embodiments, the wet etch barrier layer defines a gap on the nitride liner edge and the edge insulating layer is provided on the nitride line edge in the gap.

According to other embodiments of the present invention, methods of manufacturing a semiconductor device are provided. These methods include forming a trench in a substrate, forming a sidewall oxide layer on an inner wall of the trench, forming a nitride liner on the sidewall oxide layer and forming a gap-fill insulating layer on the nitride liner to fill the trench. A first impurity doped oxide layer is formed at an edge region of the sidewall oxide layer adjacent to an entry of the trench by doping an impurity in an exposed portion of the sidewall oxide layer from the entry of the trench. A second impurity doped oxide layer extending from an end portion of the nitride liner may be formed on a surface of the gap-fill insulating layer at the same time as forming the first impurity doped oxide layer.

In some embodiments, a plasma treatment may be performed on an exposed portion of the sidewall oxide layer in an atmosphere containing $N_2$ gas in order to form the first and/or second impurity doped oxide layers.

According to other method embodiments of the present invention, a dent filling insulating layer is filled in a dent space formed on the nitride liner after the first impurity doped oxide layer and the second impurity doped oxide layer are formed. To form the dent filling insulating layer, after an insulating layer is formed on the first impurity doped oxide layer and on the second impurity doped oxide layer so that the dent space is filled, a part of the insulating layer may be removed so that only the dent filling insulating layer remains.

According to various embodiments of the present invention, when an isolation layer is formed in a trench, even though the subsequent washing (wet etching) processes are performed in the state in which a dent is formed on a nitride liner, the formation of a recess by consuming a sidewall oxide layer and a gap-fill insulating layer may be reduced or prevented by the first and/or second impurity doped oxide layers that are formed on exposed portions of the sidewall oxide layer and the gap-fill insulating layer. Thus, even though a dent is formed by consumption of a nitride liner, device inferiorities or deterioration of electric properties, which may result due to consumption of insulating layers can be reduced or prevented.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
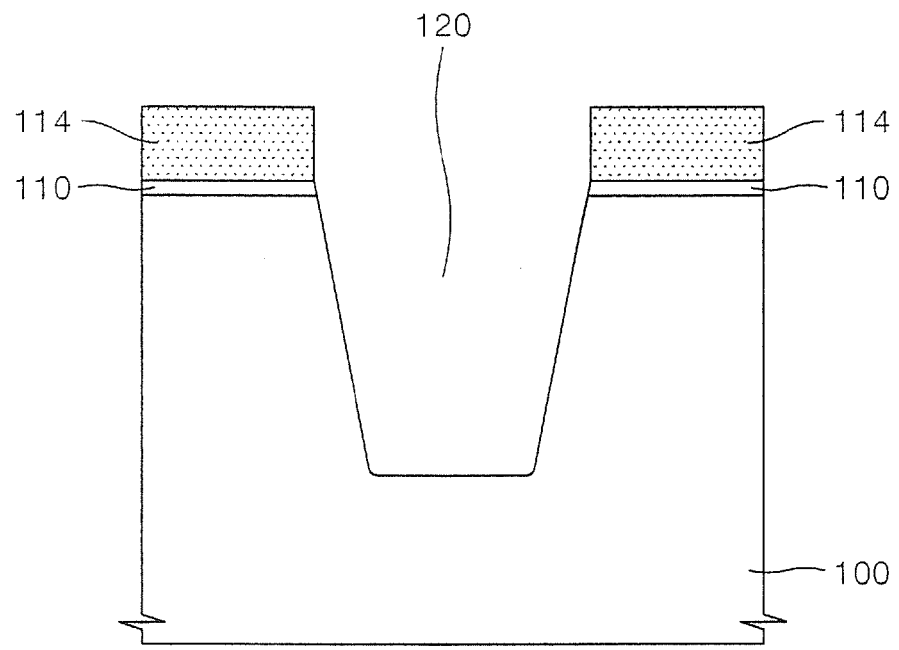
FIG. 1A through FIG. 1I are sectional views illustrating sequential processes of manufacturing of semiconductor devices according to first embodiments of the present invention, and devices so fabricated.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A through FIG. 1I are sectional views illustrating sequential processes of manufacturing of semiconductor devices according to first embodiments of the present invention, and semiconductor devices so fabricated.

Referring to FIG. 1A, a pad oxide layer and a nitride layer are sequentially formed on an upper surface of a semiconductor (i.e., integrated circuit) substrate 100, for example, a silicon substrate. For example, the pad oxide layer may be formed to a thickness of about 50 Å to about 150 Å using a thermal oxidation process. The nitride layer may be made of a silicon nitride layer formed to a thickness of about 1200 Å to about 1600 Å using a chemical vapor deposition (CVD) process. Then, a pad oxide layer pattern 110 and a nitride layer pattern 114 are formed exposing an isolation region of the semiconductor substrate 100 by patterning the nitride layer and the pad oxide layer by using a photolithography process.

Afterwards, a trench 120 is formed by dry etching the semiconductor substrate 100, which is exposed by using the pad oxide layer pattern 110 and the nitride layer pattern 114 as etching masks, to a predetermined depth. The trench 120 may be formed to a depth of about 250 nm to about 350 nm.

Figure 1B:
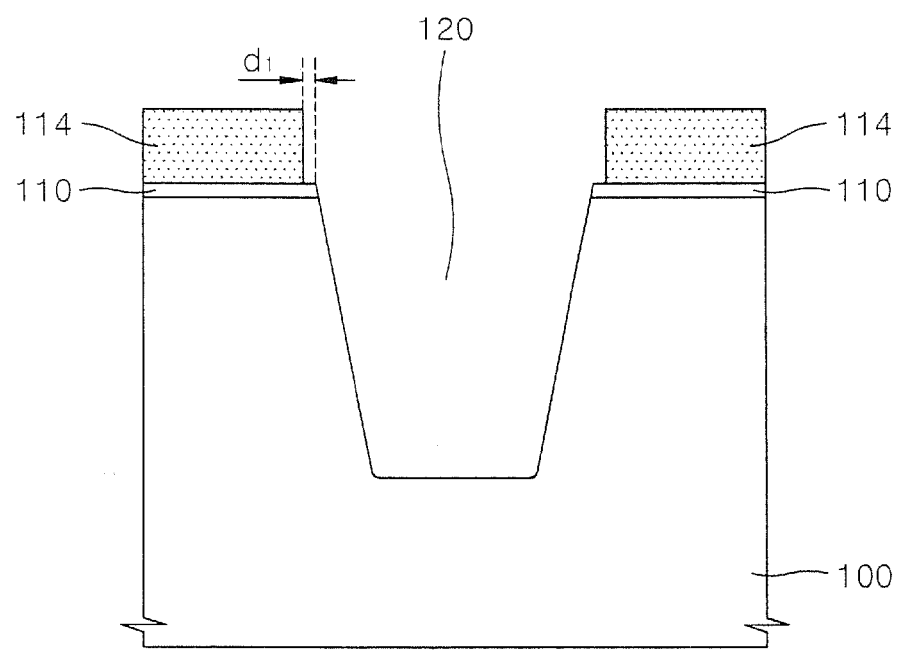

Referring to FIG. 1B, a pullback process is performed on the nitride layer pattern 114 to remove a predetermined thickness of the nitride layer pattern 114 by using an isotropic etching process so that a sidewall of the nitride layer pattern 114 does not cover an entry of the trench 120. A strip process using a phosphate solution can be performed on the nitride layer pattern 114 to perform the pullback process. A sidewall edge of the nitride layer pattern 114 may be spaced a given distance $d_1$ away from the entry of the trench 120 by the pullback process.

Figure 1C:
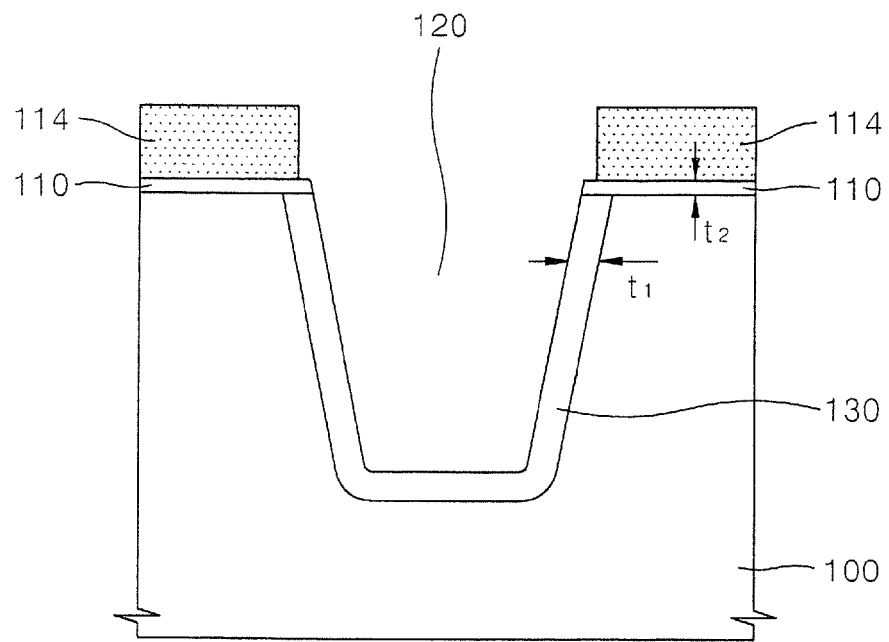

Referring to FIG. 1C, a sidewall oxide layer 130 is formed on an inner wall of the trench 120. To form the sidewall oxide layer 130, for example, a surface of the semiconductor substrate 100 exposed in the trench 120 may be oxidized to a given thickness $t_1$ by a thermal oxidation process. At this point, an oxidation thickness in the surface of the semiconductor substrate 100 exposed in the trench 120 may be controlled so that the thickness $t_1$ of the sidewall oxide layer 130 in the sidewall of the trench 120 is greater than a thickness $t_2$ of the pad oxide layer pattern 110. For example, the thickness $t_1$ of the sidewall oxide layer 130 in the sidewall of the trench 120 may be formed to be twice the thickness $t_2$ of the pad oxide layer pattern 110.

By forming the sidewall oxide layer 130, the surface of the semiconductor substrate 100 damaged during the dry etching to form the trench 120 may be cured, and a leakage current which may be generated due to a damaged substrate can be reduced or prevented. Also, corner portions of the trench 120 can be rounded off.

Figure 1D:
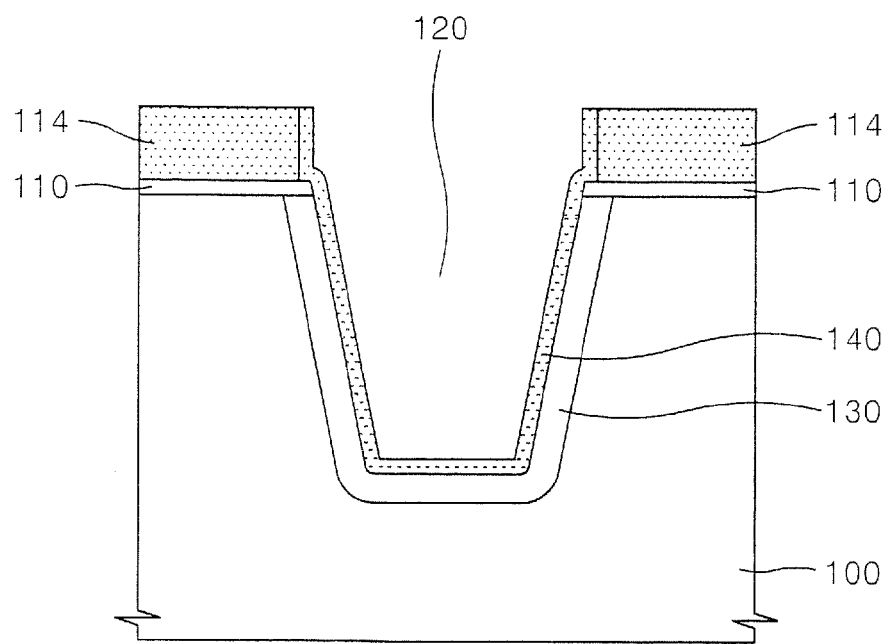

Referring to FIG. 1D, a nitride liner 140 is formed on the sidewall oxide layer 130 remote from the inner wall of the trench 120. To form the nitride liner 140, for example, a silicon nitride layer having a thickness of about 50 Å to about 100 Å may be formed on an exposed surface of the resultant structure of the forming of the sidewall oxide layer 130. By forming the nitride liner 140, stresses generated due to a difference of thermal expansion coefficient between an insulating layer to be filled in the trench 120 and the sidewall oxide layer 130 can be reduced. Also, additional oxidation of the inner wall of the trench 120 may be reduced or prevented when oxygen is permeated into the sidewall oxide layer 130 during an oxidation process to form a subsequent gate oxide layer or an insulating layer.

Figure 1E:
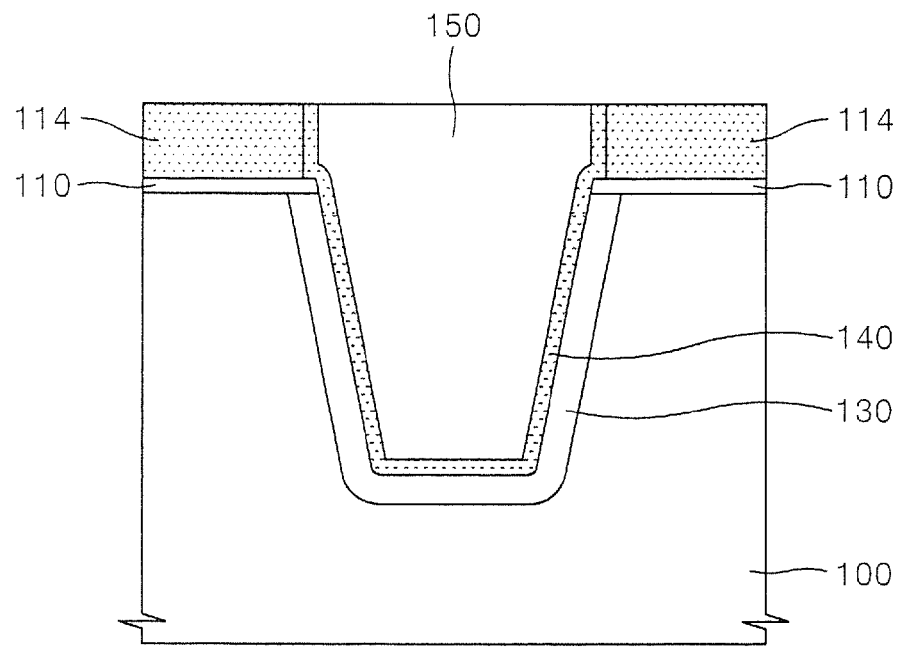

Referring to FIG. 1E, an oxide layer is deposited on the nitride liner 140 to fill the inner portion of the trench 120, and then thermal treatment is performed thereon to make it dense. Then, a gap-fill insulating layer 150 is formed in the trench 120 by performing a chemical mechanical polishing (CMP) process and/or an etch back process until the nitride layer pattern 114 is exposed. To make the oxide layer dense, for example, the oxide layer can be annealed in a comparatively hot temperature of about 900° C. to 1050° C. for about 1 hour in an $N_2$ atmosphere, or can be annealed in a comparatively low temperature of about 700° C. for about 30 minutes in a steam atmosphere, and then can be subsequently annealed in a comparatively hot temperature of about 900° C. to 1050° C. for about 1 hour in an $N_2$ atmosphere.

The gap-fill insulating layer 150 may be made of, for example, a high density plasma (HDP) oxide layer and/or a CVD oxide layer such as an undoped silicate glass (USG) and/or a tetraethyl orthosilicate ($O_3$-TEOS). In particular, when the $O_3$-TEOS layer is formed, a semi-atmosphere chemical vapor deposition (SACVD) process can be used.

Figure 1F:
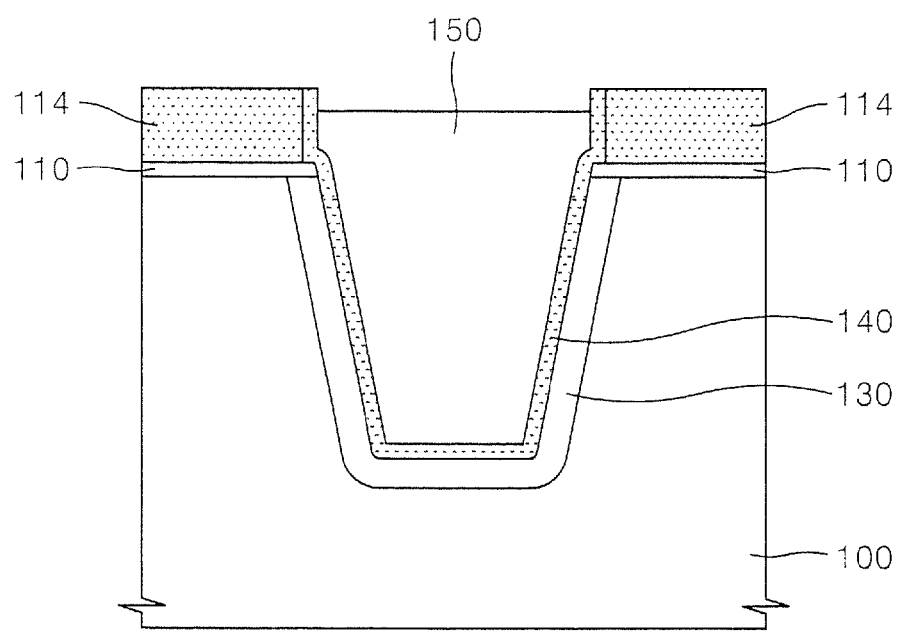

Referring to FIG. 1F, to reduce or exclude the possibility of residues of the oxide layer existing on an upper surface of the nitride layer pattern 114, the resultant structure of the forming of the gap-fill insulating layer 150 is washed with an etching solution (i.e., wet etched) capable of selectively removing the oxide layer. Consequently, a level of an exposed surface of the gap-fill insulating layer 150 becomes lower than a level of an exposed surface of the nitride layer pattern 114.

Figure 1G:
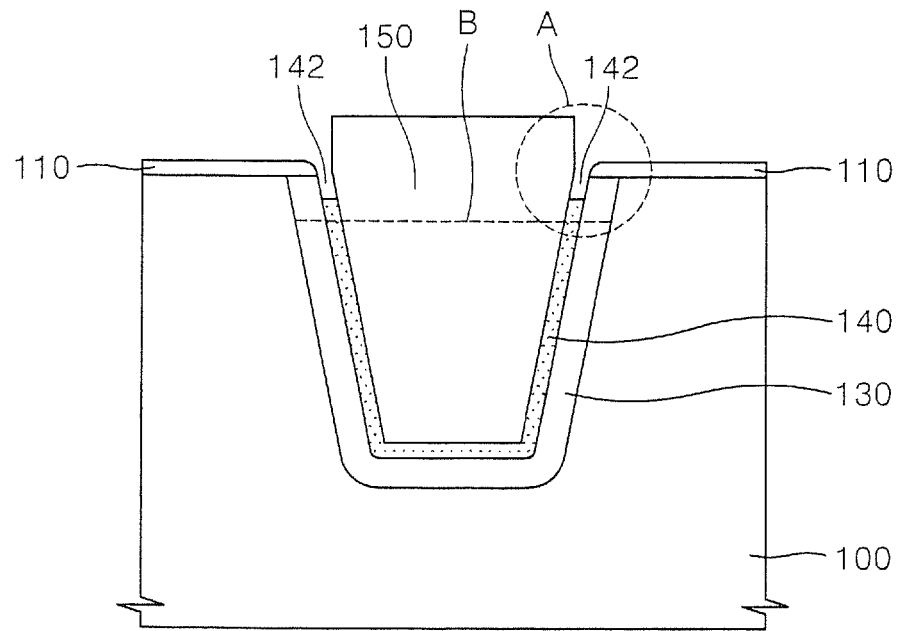

Referring to FIG. 1G, to remove the nitride layer pattern 114 used as the etching mask when the trench 120 is formed, a wet washing (etching) process is performed using the phosphate solution. At this point, when the nitride layer pattern 114 is removed by the wet washing process, a part of the nitride liner 140 exposed around an upper edge of the trench 120 is simultaneously removed. Consequently, as shown in FIG. 1G, a dent 142 (shown in the portion "A"), which is a space formed by forming the nitride liner 140 to be lower than an upper surface of the semiconductor substrate 100 around the gap-fill insulating layer 150, is formed.

As shown in FIG. 1G, when subsequent conventional processes are performed for forming a gate oxide layer and a gate in the state in which the dent 142 is formed, the pad oxide layer pattern 110 as well as a part of the sidewall oxide layer 130 and the gap-fill insulating layer 150 which are exposed by the dent 142 can be removed while washing processes are performed. In particular, layers, for example, the sidewall oxide layer 130 and the gap-fill insulating layer 150 which are located around the dent 142 can be physically deteriorated due to physical stresses generated while the thermal treatment is performed after depositing an insulating material in the trench in order to form the isolation layer. When the upper surfaces of the sidewall oxide layer 130 and the gap-fill insulating layer 150, which are physically deteriorated, are exposed in the various subsequent washing processes, a problem, in which the upper surfaces of the sidewall oxide layer 130 and the gap-fill insulating layer 150 are recessed to a level (for example, a level represented as "B" in FIG. 1G) that is lower than a level of the exposed edge of the nitride liner 140, may occur.

In particular, when the sidewall oxide layer 130 formed on the inner wall of the trench 120 is consumed to be recessed to a level that is lower than a level of the nitride liner 140, a moat may be formed around source and drain regions to be formed in an active region defined by the trench in the semiconductor substrate 100, and an edge portion of the active region exposed by the moat may be lost. Also, as described above, when a conductive material for forming the gate is deposited in the state in which the moat is formed by the recess of the insulating layer around the active region, and then is patterned to form the gate, the conductive material for forming the gate may not be removed and may remain in the moat. Therefore, a short between the gate and the source/drain regions and/or between adjoining gates may occur, or deterioration of electric properties of transistor or a leakage current may occur. To reduce or prevent those problems, it is desirable to suppress the amount of consuming by the subsequent successive washing processes which occurs on the sidewall oxide layer 130 and the gap-fill insulating layer 150 which are exposed by the dent 142.

Figure 1H:
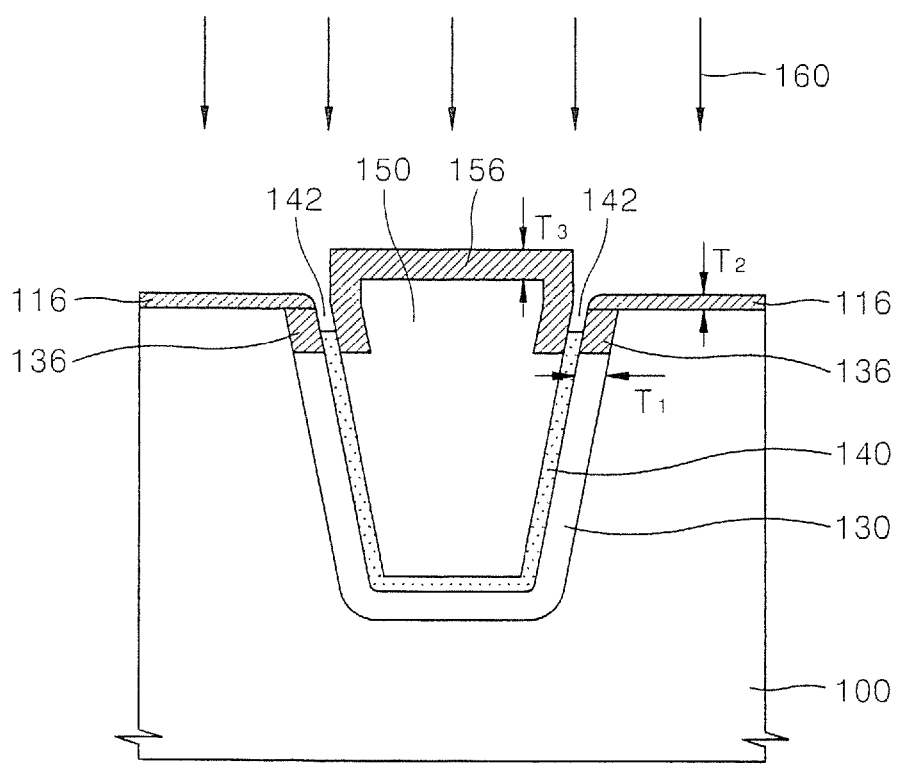

Referring to FIG. 1H, to suppress the amount of consuming by the subsequent successive washing processes which occurs on the sidewall oxide layer 130 and the gap-fill insulating layer 150 which are exposed by the dent, an impurity 160 is doped in an exposed portion of the sidewall oxide layer 130 and the gap-fill insulating layer 150 to form impurity doped oxide layers 136 and 156 on the surface thereof. By forming the impurity doped oxide layers 136 and 156 on the surface of the sidewall oxide layer 130 and the gap-fill insulating layer 150 which are exposed by the dent exposed by the dent 142, the amount of the sidewall oxide layer 130 and the gap-fill insulating layer 150 which is consumed by the subsequent successive washing processes can be reduced or prevented even while the subsequent successive washing processes are performed.

To form the impurity doped oxide layers 136 and 156, a nitrogen plasma treatment, for example, can be performed on the surface of the sidewall oxide layer 130 and on the gap-fill insulating layer 150 which are exposed by the dent 142. In this case, N atoms are doped on the surface in which the sidewall oxide layer 130 and the gap-fill insulating layer 150 are exposed, thereby obtaining the impurity doped oxide layers 136 and 156 made of an N-doped oxide layer. At this point, the N atoms are doped on the pad oxide layer pattern 110 as well as on the sidewall oxide layer 130 and the gap-fill insulating layer 150 which are exposed on the semiconductor substrate 100, and accordingly the pad oxide layer pattern 110 is changed into an impurity doped oxide layer 116 made of an N-doped oxide layer.

In some embodiments, the plasma treatment is performed until impurity is completely doped over a total thickness $t_1$ of the sidewall oxide layer 130 exposed by the dent 142. Accordingly, since the thickness $t_1$ of the sidewall oxide layer 130 is greater than a thickness $t_2$ of the pad oxide layer pattern 110 in the sidewall of the trench 120, a thickness $T_1$ of the impurity doped oxide layer 136 is greater than a thickness $T_2$ of the impurity doped oxide layer 116 around the dent 142. Also, since the plasma treatment may be performed until the impurity is completely doped over a total thickness $t_1$ of the sidewall oxide layer 130 exposed by the dent 142, the impurity is doped to a thickness corresponding to the total thickness $t_1$ of the sidewall oxide layer 130 or to a thickness greater than thickness $t_1$ on the surface of the gap-fill insulating layer 150. Accordingly, the impurity doped oxide layer 156 having a thickness $T_3$ which is the same as the thickness $T_1$ or greater than the thickness $T_1$ is formed on the surface of the gap-fill insulating layer 150.

For example, the plasma treatment for forming the impurity doped oxide layers 116, 136 and 156 can be performed at a temperature in the range of about 400° C. to about 800° C. in an atmosphere including $N_2$ gas. The plasma treatment can be performed in an atmosphere containing only $N_2$ gas or in a mixed gas atmosphere containing $N_2$ gas and $H_2$, $O_2$, He and/or Ar. When the mixed gas containing additional gas is used, the additional gas can be added with an amount in the range of volume of less than about 50% with respect to a total amount of the mixed gas. In a specific embodiment of the present invention, when the plasma treatment is performed, an RF power can be controlled to be selected in the range of about 400 W to about 1200 W, but it is not limited thereto. A desired RF power can be applied according to various power conditions. Under different conditions, a remote plasma method may be used to perform the plasma treatment process. In other embodiments, a bias power in the range of about 100 W to about 500 W together with the RF power when the plasma treatment process is performed.

A concentration of the impurity, for example N atoms, in the impurity doped oxide layers 116, 136 and 156 can be selected in the range of about $1 \times 10^{14}$ cm$^{-3}$ to about $1 \times 10^{16}$ cm$^{-3}$.

When the impurity doped oxide layers 116, 136 and 156, which are formed using the above methods, are exposed by a wet etching solution for removing the oxide layer, the impurity doped oxide layers 116, 136 and 156 can provide an excellent etching tolerance compared to a conventional oxide layer.

Figure 1I:
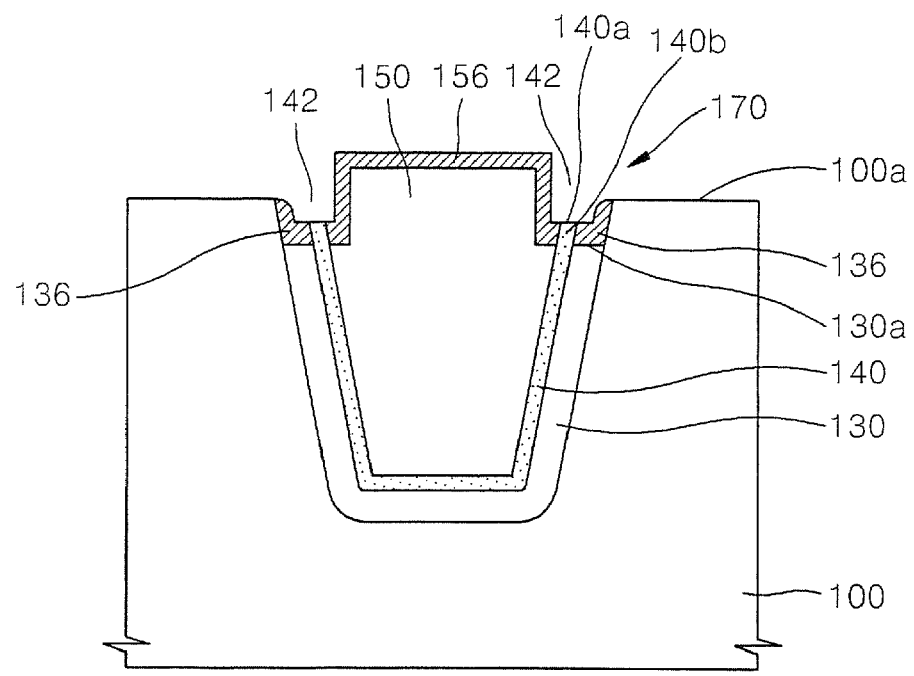

Referring to FIG. 1I, the impurity doped oxide layer 116 covering an upper surface of the semiconductor substrate 100 is removed. Consequently, a STI structure 170, in which the impurity doped oxide layers 136 and 156 are formed around both end portions of the nitride liner 140 at edges of the trench, is obtained.

Embodiments of FIG. 1I may also be regarded as describing a semiconductor device that includes a substrate 100 including a trench extending therein from a surface 100a thereof and having a trench wall. A sidewall oxide layer 130 is provided on the trench wall that includes a sidewall oxide layer edge 130a that is recessed from the surface 100a of the substrate. A nitride liner 140 is provided on the sidewall oxide layer 130 remote from the trench wall that includes a nitride liner edge 140a. The sidewall oxide layer edge 130a is also recessed from the nitride liner edge 140a, such that the nitride liner 140 includes a protruding portion 140b relative to the sidewall oxide layer edge 130a. A trench insulating layer 150 is provided on the nitride liner 140 remote from the sidewall oxide layer 130. A wet etch barrier layer 136 extends along the trench wall from the surface 100a of the substrate to the sidewall oxide layer edge 130a, along the sidewall oxide layer edge 130a to the protruding portion 140b of the nitride layer 140 and along the protruding portion 140a of the nitride layer 140. Moreover, the wet etch barrier layer 156 may also extend from the protruding portion 140b of the nitride layer 140 along the trench insulating layer 150.

When the impurity doped oxide layer 116 covering the upper surface of the semiconductor substrate 100 is removed, since the thickness $T_1$ of the impurity doped oxide layer 136 is greater than the thickness $T_2$ of the impurity doped oxide layer 116, even though the impurity doped oxide layer 116 covering the upper surface of the semiconductor substrate 100 is completely removed, the impurity doped oxide layer 136 remains on the sidewall oxide layer 130 around the dent 142. Thus, consumption of the sidewall oxide layer 130 by the wet etching solution can be suppressed in the subsequent washing processes. Accordingly, generation of a moat due to the recess of the sidewall oxide layer 130 around the active region of the semiconductor substrate 100 limited by the trench 120 can be reduced or prevented. Also, after the impurity doped oxide layer 116 is completely removed, a part of the impurity doped oxide layer 156 can remain on the upper surface of the gap-fill insulating layer 150. Thus, consumption of the gap-fill insulating layer 150 in the subsequent washing processes can be reduced or prevented. Accordingly, the likelihood of undesired recesses being formed in the trench 120 can be reduced or prevented.

Under different conditions, the impurity doped oxide layer 116 can be removed in a washing process that is conventionally performed to form the subsequent gate insulating layer. In this case, there may be no need to perform any special etching process to remove the impurity doped oxide layer 116.

In the STI structure 170, the impurity doped oxide layer 136, which is formed at edge regions of both end portions 130a of the sidewall oxide layer 130 is interposed between the inner wall of the trench 120, and the nitride liner 140. The sidewall oxide layer 130 covers the inner wall of the trench 120 inside the trench 120 so as not to be exposed to outside of the STI structure 170. The impurity doped oxide layer 156 is formed at the edge regions of both end portions 130a of the sidewall oxide layer 130 so as to extend from the sidewall of the trench 120 adjacent to the upper surface of the semiconductor substrate 100 to one protruding portion 140b of the nitride liner 140 in an edge region adjacent to the entry of the trench 120. The impurity doped oxide layer 156 extending from both end portions of the nitride liner 140 is formed in the surface of the gap-fill insulating layer 150.

Under different conditions, in the STI structure 170, a high level portion of the impurity doped oxide layer 156 formed on the surface of the gap-fill insulating layer 150, particularly, at least a part of a portion of the impurity doped oxide layer 156 that covers the upper surface of the gap-fill insulating layer 150 in a center region of the trench 120, may be consumed while the subsequent successive washing processes are performed. Consequently, a process for forming the subsequent gate insulating layer can be performed in the state in which the gap-fill insulating layer 150 is externally exposed.

Afterwards, source and drain regions can be formed in the semiconductor substrate 100 by performing a process for forming a conventional transistor, and a process for forming the gate insulating layer and the gate can be performed. Even when the washing (i.e. wet etching) processes are performed a plurality of times while those successive processes proceed, in the STI structure 170 exposed on the semiconductor substrate 100, since the impurity doped oxide layers 136 and 156 are respectively formed in the surface of the sidewall oxide layer 130 and the surface of the gap-fill insulating layer 150 which are adjacent to both end portions 140a of the nitride liner 140, consumption of the sidewall oxide layer 130 and the gap-fill insulating layer 150 can be reduced or prevented, and formation of a recess near the edge of the entry of the trench 120 can be reduced or even completely prevented.

Figure 2A:
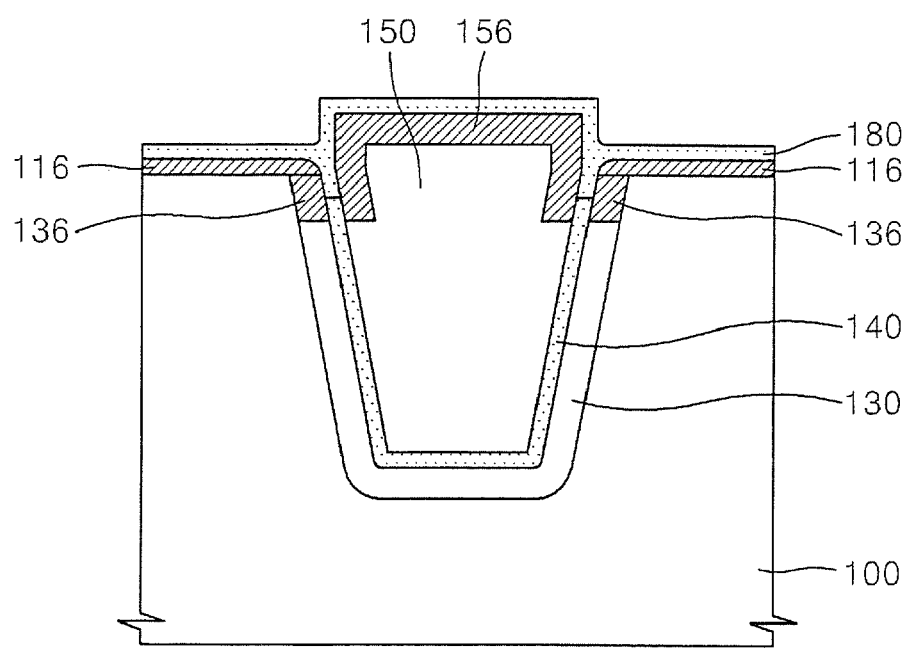
FIG. 2A through FIG. 2C are sectional views illustrating sequential processes of manufacturing of semiconductor devices according to second embodiments of the present invention, and devices so fabricated.
Figure 2B:
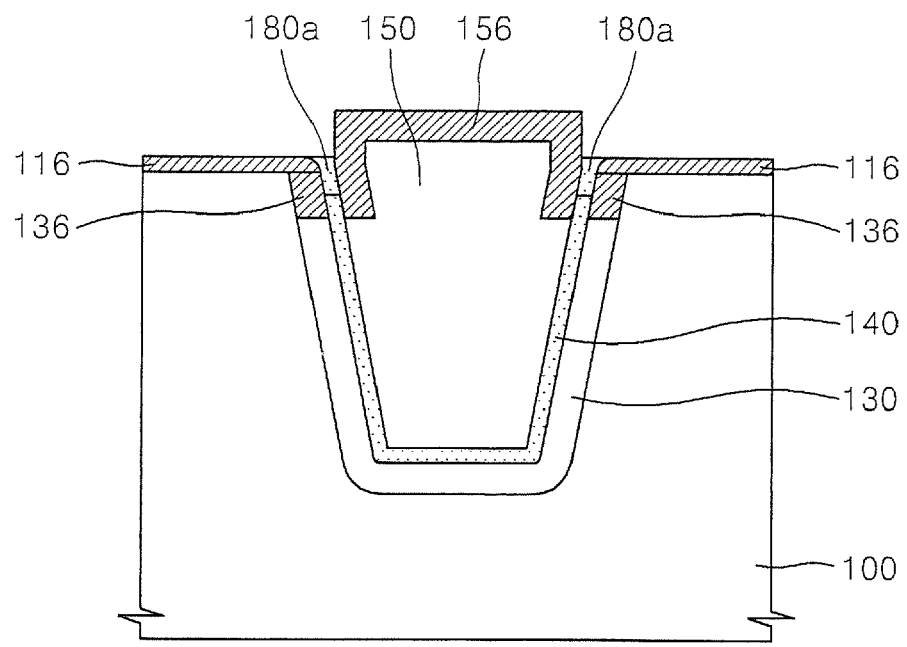
Figure 2C:
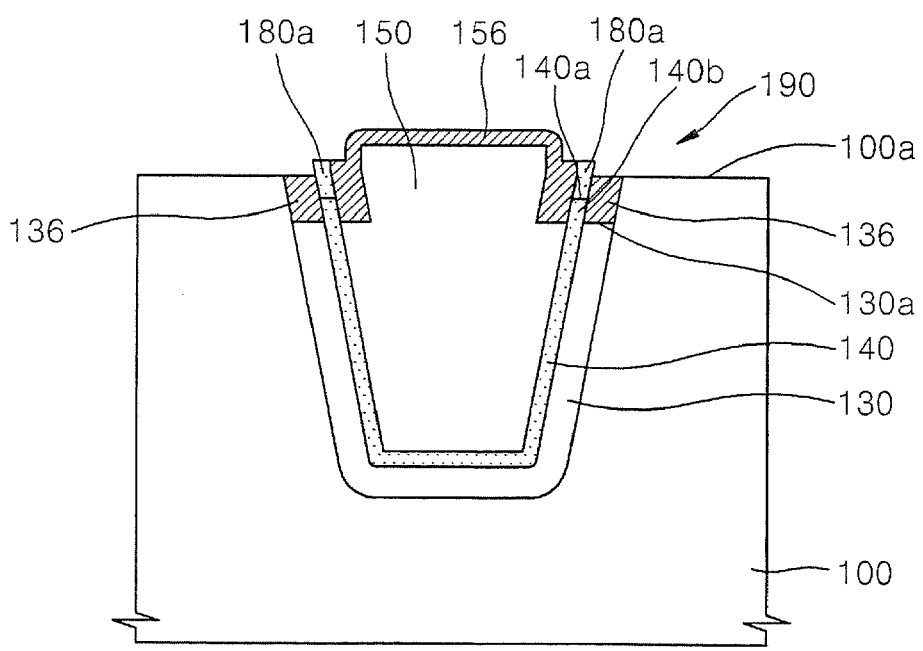

FIG. 2A through FIG. 2C are sectional views illustrating sequential processes of manufacturing of semiconductor devices according to second embodiments of the present invention, and devices so formed. In FIG. 2A through FIG. 2C, the same reference numbers as in FIG. 1A through FIG. 1I represent the same elements. Accordingly, detailed description of them will be omitted.

The second embodiments can be similar to the first embodiments. However, before removing the impurity doped oxide layer 116 covering the upper surface 100a of the semiconductor substrate 100 as in the process described in FIG. 1I, a process, in which a dent formed around edges of the both end portions is filled with a dent filling insulating layer 180a (referring to FIG. 2b), is included. Differences of the above process will now be described.

Referring to FIG. 2A, as described in FIG. 1H, the impurity doped oxide layers 116, 136 and 156 are formed by respectively doping the impurity 160 on the exposed surfaces of the pad oxide layer 110, and the sidewall oxide layer 130 and the gap-fill insulating layer 150 which are exposed by the dent 142. Then, as shown in FIG. 2A, an insulating layer 180 having a sufficient thickness to completely fill the dent 142 around the edges of the both end portions of the nitride liner 140 is formed on the nitride liner 130 and on the impurity doped oxide layers 116, 136 and 156. For example, the insulating layer 180 may be made of an oxide layer, an oxynitride layer and/or a nitride layer.

Referring to FIG. 2B, a part of the insulating layer 180, that is a portion covering the upper surface of the impurity doped oxide layers 116 and 156, is removed so that only a dent filling insulating layer 180a which fills the dent 142 in the insulating layer 180 remains. To remove a part of the insulating layer 180, a strip process using a phosphate solution and/or a dry etch back process can be performed.

Referring to FIG. 2C, the impurity doped oxide layer 116 covering the upper surface 100a of the semiconductor substrate 100 is removed, for example, using the methods described in FIG. 1I. Consequently, a STI structure 190, in which a sidewall of the impurity doped oxide layer 136 and a sidewall of the impurity doped oxide layer 156 are respectively protected by the dent filling insulating layer 180a at the edges of the entry of the trench, is obtained.

Embodiments of FIG. 2C may also be regarded as providing an edge insulating layer 180a on the nitride liner edge 140a and extending onto the wet etch barrier layer 136. Embodiments of FIG. 2C may also be regarded as the wet etch barrier layer 156, 136 defining a gap on the nitride liner edge 140a, wherein an edge insulating layer 180a is provided on the nitride liner edge 140a in the gap.

In the STI structure 190, the impurity doped oxide layer 136, which is formed at the edge of the both end portions 130a of the sidewall oxide layer 130, is interposed between the semiconductor substrate 100 and the nitride liner 140. Also, the surface of the impurity doped oxide layer 136 is covered by the dent filling insulating layer 180a inside the trench 120. Accordingly, consumption of the impurity doped oxide layer 136 and the sidewall oxide layer 130 which is located in a lower portion of the impurity doped oxide layer 136 by the subsequent washing processes can be effectively reduced or prevented.

As described in FIG. 1I, under different conditions, in the STI structure 190, a portion covering the upper surface of the gap-fill insulating layer 150 in a center region of the trench 120 can be consumed while the subsequent successive washing processes are performed. Consequently, the subsequent process for forming the gate insulating layer can be performed in the state in which the gap-fill insulating layer 150 is externally exposed.

Afterwards, source and drain regions may be formed in the semiconductor substrate 100 by performing a process forming a conventional transistor, and then a process forming the gate insulating layer and the gate may be performed. Even when washing (i.e., wet etching) processes are performed a plurality of times while those successive processes proceed, in the STI structure 190 exposed on the semiconductor substrate 100, since the impurity doped oxide layers 136 and 156 are respectively formed on the surface of the sidewall oxide layer 130 and the surface of the gap-fill insulating layer 150 which are adjacent to both end portions of the nitride liner 140, and the sidewalls of the impurity doped oxide layers 136 and 156 are respectively protected by the dent filling insulating layer 180a formed at both end portions 140a of the nitride liner 140 in the trench 120, consumption of the sidewall oxide layer 130 and the gap-fill insulating layer 150 can be reduced or prevented, and formation of a recess around edges of the entry of the trench 120 can be reduced or prevented.

In semiconductor devices according to some embodiments of the present invention, a first impurity doped oxide layer is formed at edge regions of both end portions of a sidewall oxide layer so as to extend from an entry of a trench to a nitride liner. To form the first impurity doped oxide layer, an impurity is doped in an exposed portion of a sidewall oxide layer from the entry of the trench. At this point, a second impurity doped oxide layer can be formed in an upper surface of a gap-fill insulating layer as well.

According to some embodiments of the present invention, when an isolation layer is formed in a trench, even though subsequent washing (wet etching) processes are performed in the state in which a dent is formed on a nitride liner, formation of a recess by consumption of a sidewall oxide layer and a gap-fill insulating layer can be reduced or prevented by first and second impurity doped oxide layers formed in portions exposed in the sidewall oxide layer and the gap-fill insulating layer. Thus, according to some embodiments of the present invention, even though a dent is formed by consumption of a nitride liner in an upper edge portion of a trench adjacent to an upper surface of a substrate in a STI structure, device inferiorities or deterioration of electric properties, which may occur by consumption of insulating layers in the surroundings, can be reduced or prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
a substrate including a trench therein;
a sidewall oxide layer on an inner wall of the trench;
a nitride liner on the sidewall oxide layer, remote from the inner wall of the trench;
a gap-fill insulating layer on the nitride liner to fill the trench; and
an impurity doped oxide layer that is confined to within the trench, that is located at edge regions of both end portions of the sidewall oxide layer and extending from an entry of the trench adjacent to a surface of the substrate, to the nitride liner, but not extending onto the surface of the substrate outside the trench;
wherein an uppermost portion of the nitride layer is at a lower level than the surface of the substrate.

2. The semiconductor device of claim 1, wherein the impurity doped oxide layer consists of a silicon oxide layer doped with N atoms.

3. The semiconductor device of claim 2, wherein a doping concentration of the N atoms in the impurity doped oxide layer is about $1\times10^{14}$ cm$^{-3}$ to about $1\times10^{16}$ cm$^{-3}$.

4. The semiconductor device of claim 1, wherein the impurity doped oxide layer is a first impurity doped oxide layer, the device further comprising a second impurity doped oxide layer extending from the both end portions of the nitride liner to a surface of the gap-fill insulating layer.

5. The semiconductor device of claim 1, further comprising a dent filling insulating layer on a surface of the impurity doped oxide layer and on the nitride liner.

6. The semiconductor device of claim 5, wherein the dent filling insulating layer comprises an oxide layer, a nitride layer and/or an oxynitride layer.

7. The semiconductor device of claim 1, wherein the impurity doped oxide layer is a first impurity doped oxide layer, the device further comprising:
a second impurity doped oxide layer extending from the both end portions of the nitride liner to the surface of the gap-fill insulating layer; and
a dent filling insulating layer on the nitride liner and filling a space between the first impurity doped oxide layer and the second impurity doped oxide layer.

8. A semiconductor device comprising:
a substrate including a trench extending therein from a surface thereof and having a trench wall;
a sidewall oxide layer on the trench wall that includes a sidewall oxide layer edge that is recessed from the surface of the substrate;
a nitride liner on the sidewall oxide layer remote from the trench wall that includes a nitride liner edge, wherein the sidewall oxide layer edge is also recessed from the nitride liner edge such that the nitride liner includes a protruding portion relative to the sidewall oxide layer edge;
a trench insulating layer on the nitride liner remote from the sidewall oxide layer; and
a wet etch barrier layer that is confined to within the trench, that extends along the trench wall from the surface of the substrate to the sidewall oxide layer edge, along the sidewall oxide layer edge to the protruding portion of the nitride layer and along the protruding portion of the nitride layer, but does not extend onto the surface of the substrate outside the trench;
wherein the nitride liner edge is at a lower level than the surface of the substrate.

9. The semiconductor device of claim 8 wherein the wet etch barrier layer also extends from the protruding portion of the nitride layer along the trench insulating layer.

10. The semiconductor device of claim 8 further comprising an edge insulating layer on the nitride layer edge and extending onto the wet etch barrier layer.

11. The semiconductor device of claim 9 wherein the wet etch barrier layer defines a gap on the nitride liner edge, the device further comprising an edge insulating layer on the nitride liner edge in the gap.

* * * * *